United States Patent [19]

Nakamura et al.

[11] Patent Number: 5,227,665
[45] Date of Patent: Jul. 13, 1993

[54] SEMICONDUCTOR INTEGRATED CIRCUIT DEVICE

[75] Inventors: Youichi Nakamura, Tsuchiura; Yoshiki Shibata, Yotsukaido, both of Japan

[73] Assignee: Sharp Kabushiki Kaisha, Osaka, Japan

[21] Appl. No.: 813,825

[22] Filed: Dec. 27, 1991

[30] Foreign Application Priority Data

Dec. 27, 1990 [JP] Japan .................... 2-408258

[51] Int. Cl.⁵ .................... H01L 27/10; H01L 21/70
[52] U.S. Cl. ................................. 257/909; 437/51
[58] Field of Search .............. 357/41, 40, 45, 68; 257/909; 437/51

[56] References Cited

FOREIGN PATENT DOCUMENTS 63-29949 2/1988 Japan .

Primary Examiner—Mark V. Prenty

[57] ABSTRACT

There is provided a semiconductor integrated circuit device in which a unit circuit element row is formed by connecting unit circuit elements in a second direction, whose first length in a first direction crossing the second direction is predetermined and second length in the second direction can be varied, and a plurality of unit circuit element rows are connected to each other by connecting lines. The semiconductor integrated circuit device includes a first unit circuit element arranged apart from the nearest connecting line along the first direction by a first reference distance and a second unit circuit element projected in the first direction and arranged apart from the nearest connecting line by a second reference distance which is shorter than the first reference distance, whose second length in the second direction is reduced in comparison with the first length of the first unit circuit element.

6 Claims, 6 Drawing Sheets

SEMICONDUCTOR INTEGRATED CIRCUIT DEVICE

FIELD OF THE INVENTION

The present invention relates to a semiconductor integrated circuit including a standard cell.

DESCRIPTION OF THE RELATED ART

Figure 6:
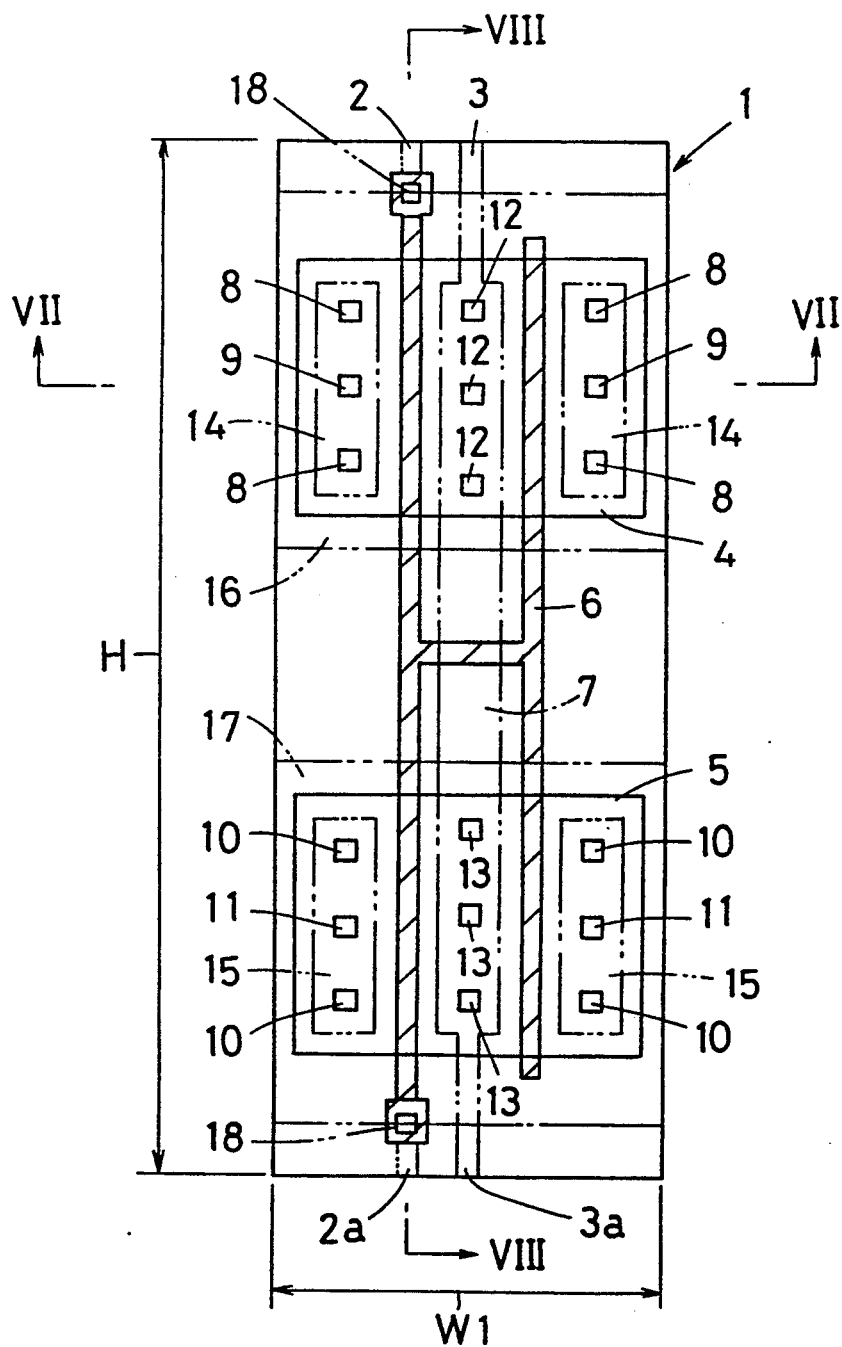
FIG. 6 is a plan view showing a conventional standard cell 1.
Figure 7:
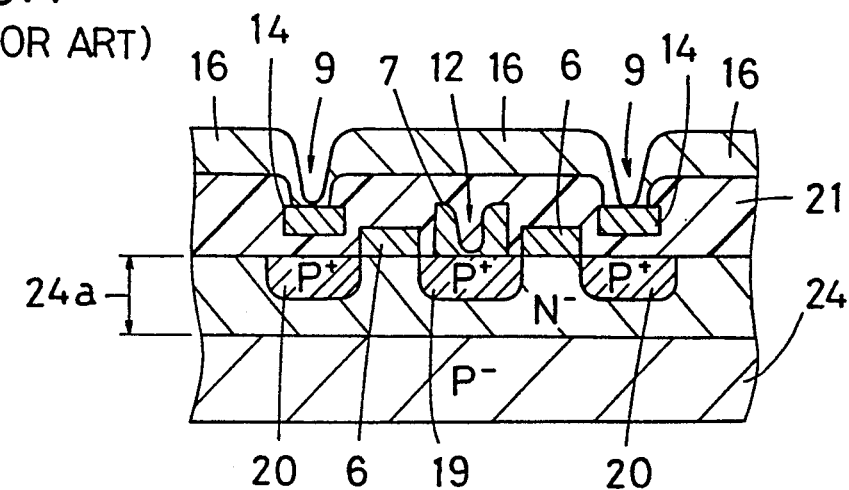
FIG. 7 is a key portion of a sectional view taken along a line VII—VII shown in FIG. 6.
Figure 8:
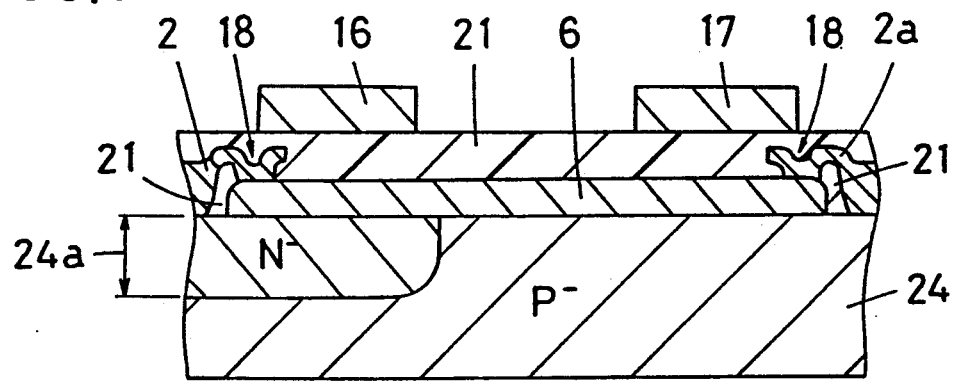
FIG. 8 is a key portion of a sectional view taken along a line VIII—VIII shown in FIG. 6 with a reduction in the lateral length.

FIG. 6 is a plan view showing a conventional standard cell 1, FIG. 7 is a sectional view taken along a line VII—VII shown in FIG. 6, and FIG. 8 is a sectional view taken along a line VIII—VIII shown in FIG. 6. These figures are referred to in the following description. The standard cell 1 is an inverter logical cell. A substrate 24 of the standard cell 1 is a P− type substrate on which an active element area 4 serving as a P channel transistor and an active element area 5 serving as an N channel transistor are arranged in the longitudinal direction of FIG. 6. An N− type layer is formed in an upper surface region 24a of the substrate 24 and the area of the N− type layer is aligned to the active element area 4.

In the active element area 4, a drain 19 serving as a P+ type layer is formed in the N− type layer of the upper surface region 24a in the longitudinal direction of FIG. 6, and two sources 20 each serving also as the P+ type layer are formed in parallel with and across the drain 19. A power source line 14 is formed above the source 20 and the power source line 14 is connected to the source 20 at a plurality of connecting positions 8.

In the active element area 5, a drain (not shown) serving as an N+ type layer is formed in the longitudinal direction of FIG. 6 and two sources (not shown) each serving also as the N+ type layer are formed in parallel with and across the drain. A ground line 15 is formed above the source and the ground line 15 is connected to the source at a plurality of connecting positions 10.

A gate 6, which is shown by slanted hatching lines in FIG. 6, is formed between the drain 19 and the source 20 in the active element area 4, and also between the drain and the source in the active element area 5 over the active element areas 4 and 5 in a shape similar to the letter H. The ends of the gate 6 are connected to input terminals 2 and 2a at connecting positions 18.

A first wiring line 7 is formed on the drain 19 of the active element area 4 and on the drain (not shown) of the active element area 5. The drain 19 in the active element area 4 is connected to the first wiring line 7 at a plurality of connecting positions 12 and the drain in the active element area 5 is connected to the first wiring line 7 at a plurality of connecting positions 13. Two ends of the first wiring line 7 in the longitudinal direction in FIG. 6 are output terminals 3 and 3a.

A power source terminal line 16 is formed above the active element area 4 with an insulator 21 inbetween so as to cover the gate 6, the first wiring line 7 and the power source line 14. The power source terminal line 16 is connected to the power source line 14 at a plurality of connecting positions 9.

A ground terminal line 17 is formed above the active element area 5 with the insulator 21 inbetween so as to cover the gate 6, the first wiring line 7 and the ground line 15. The ground terminal line 17 is connected to the ground line 15 at a plurality of connecting positions 11.

The power source terminal line 16 is a terminal for providing a power source potential and the ground terminal line 17 is a terminal for providing a ground potential.

The standard cell 1 is H in height and W1 in width as indicated in FIG. 6.

Figure 9:
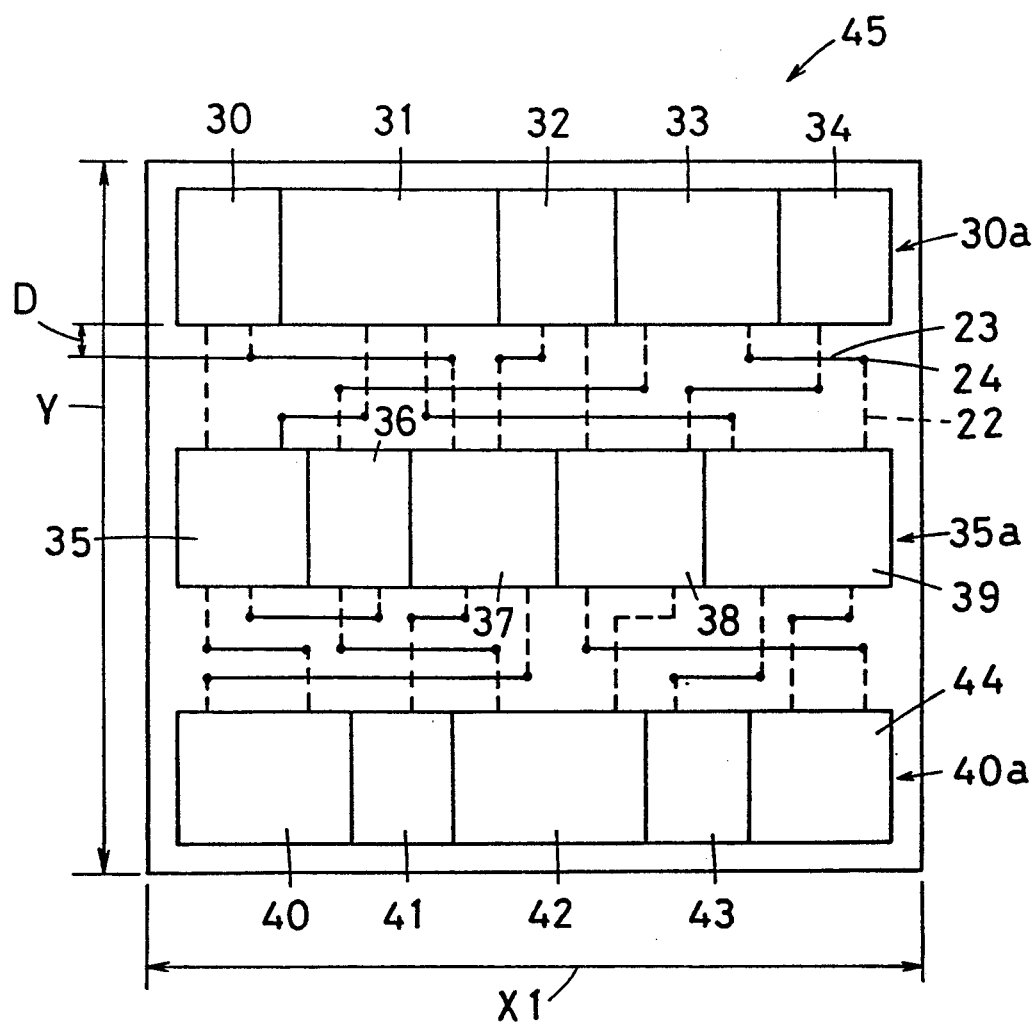
FIG. 9 is a plan view showing an example of a semiconductor integrated circuit 45 using conventional standard cells 30 to 44.

FIG. 9 is a plan view showing an example of a semiconductor integrated circuit 45 using conventional standard cells 30 to 44. The standard cells 30 to 34, 35 to 39 and 40 to 44 form cell rows 30a, 35a, 40a, respectively in the integrated circuit 45. Each of standard cells 30 to 44 and each of cell rows 30a, 35a and 40a are connected by a first layer line 22 (broken line) and a second layer line 23 (solid line). The first layer line 22 is connected to the second layer line 23 at a connecting position 24.

When the standard cells 30 to 44 and the first and second lines 22 and 23 are arranged in such a compact manner, signal interference is generated. Therefore, the standard cells 30 to 44 and the first and second lines 22 and 23 are arranged to keep a necessary distance D between them.

The integrated circuit 45 is Y in height and X1 in width as indicated in FIG. 9.

There is a rule that the standard cells 1 and 30 to 44 used in the semiconductor integrated circuit 45 should be H in height.

As is seen, one drain 19 in the active element area 4 in the standard cell 1 is provided with two sources 20 in the standard cell 1, although one drain to one source pairing is enough normally. The reason for this provision is that a length of the gate portion 6 becomes short in the case where the standard cell 1 is H is height. As a result, a sufficient output is not be obtained from the drain 19. Thus, two sources 20 are provided to allow the gate portion 6 to have a sufficient length. The same provisions are applied to the drain and the source of the active element area 5.

Because of the circumstance described above, a width W1 of the standard cell 1 is necessarily widened. Thereby, semiconductor integrated circuit 45 becomes larger in size. In addition, an area occupied by the active element areas 4 and 5 in the standard cell 1 is smaller and thereby the non-utilized part of the cell 1 is increased.

In addition, as a related art, there is known a semiconductor integrated circuit device shown in Japanese Patent Laid Open No. 29949/1988, in which a circuit element having a size larger than that of a fundamental cell is a formed in any fundamental cell of a gate array and a section of the circuit element protruding to the outside of the fundamental cell is coated with an insulating film.

SUMMARY OF THE INVENTION

It is an object of the present invention to provide an integrated circuit device in which a unit circuit element is projected in a first direction by a second reference distance and thus a length thereof in a second direction is reduced, so that the length is minimized in the second direction.

The present invention provides a semiconductor integrated circuit device in which a unit circuit element row is formed by connecting unit circuit elements in a second direction, whose length in a first direction crossing the second direction is predetermined and length in the second direction can be varied and a plurality of unit circuit element rows are connected to each other by connecting lines, the semiconductor integrated circuit device including a first unit circuit element arranged apart from the nearest connecting line along the first direction by a first reference distance and a second unit circuit element projected in the first direction and arranged apart from the nearest connecting line by a second reference distance which is shorter than the first reference distance, whose length in the second direction is reduced as compared with that of the first unit circuit element.

According to a semiconductor integrated circuit device for an embodiment of the present invention, a unit circuit element row is formed by connecting unit circuit elements in a second direction, whose first length in a first direction crossing the second direction is predetermined and second length in the second direction can be varied, and a plurality of unit circuit element rows are connected to each other by connecting lines. More specifically, a first unit circuit element is arranged apart from the nearest connecting line along the first direction by the predetermined first reference distance and a second unit circuit element containing at least one part is projected in the first direction and arranged apart from the connecting line by the second reference distance which is shorter than the first reference distance. Thereby, the second length of the second unit circuit element in the second direction is reduced as compared with the first length of the first unit circuit element.

DETAILED DESCRIPTION OF THE PREFERRED EMBODIMENTS

Figure 1:
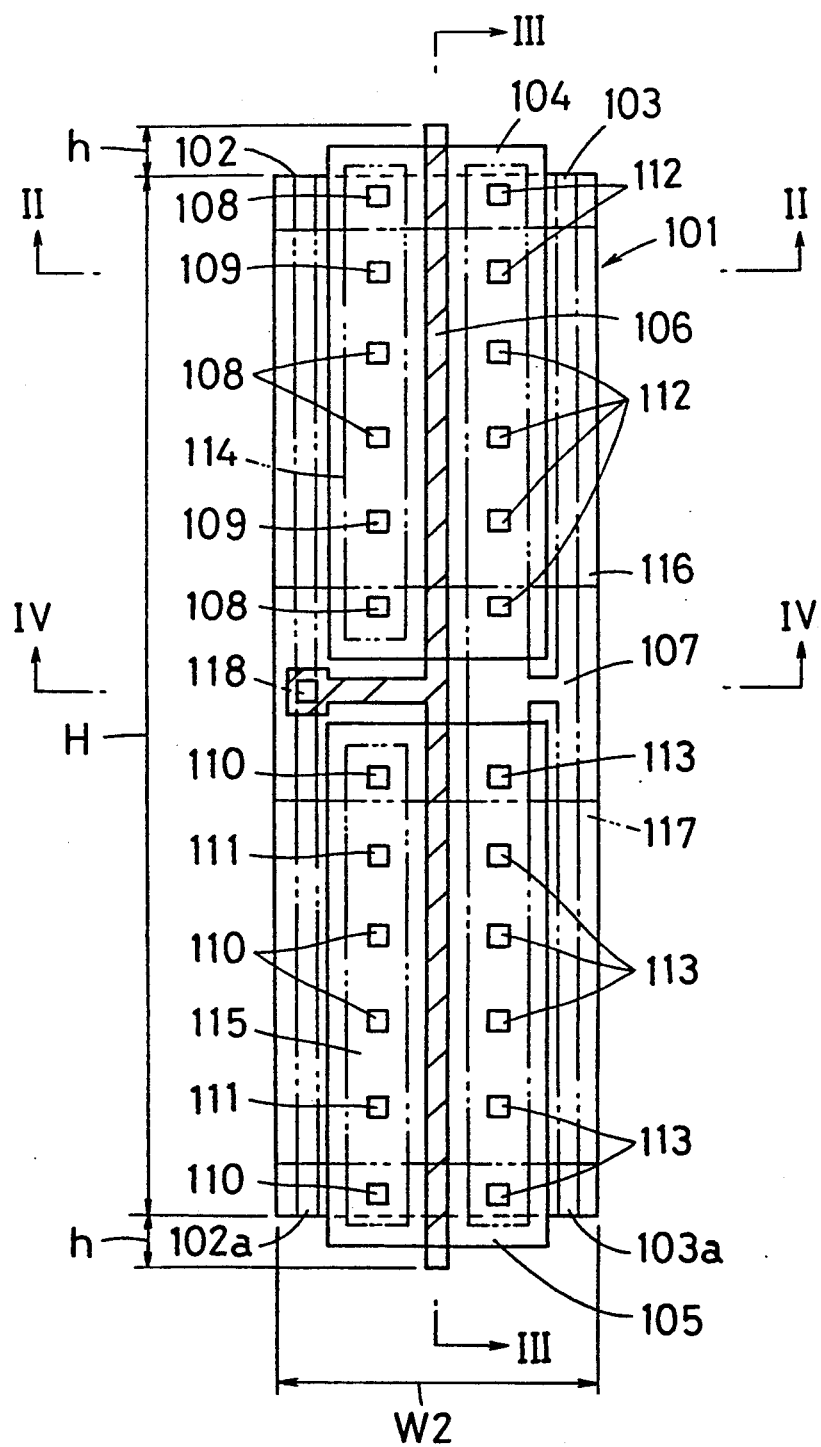
FIG. 1 is a plan view showing a standard cell 101 in accordance with an embodiment of the present invention.
Figure 2:
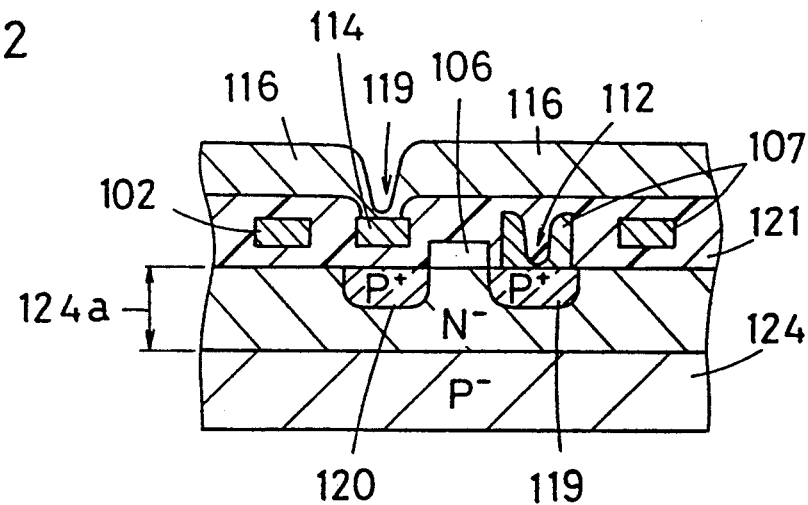
FIG. 2 is a key portion of a sectional view taken along a line II—II shown in FIG. 1.
Figure 3:
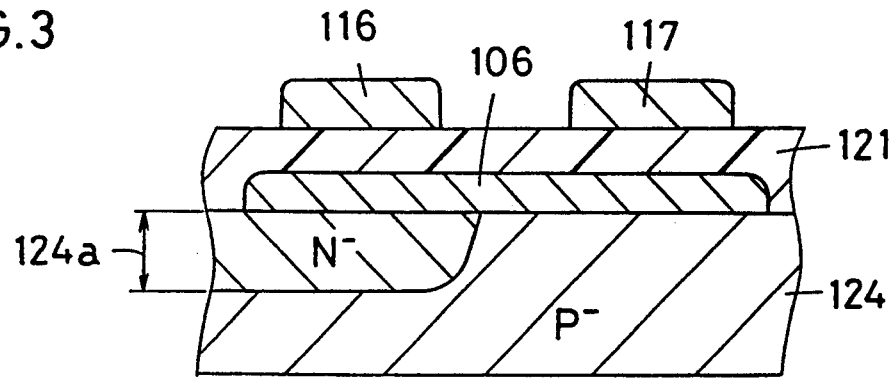
FIG. 3 is a key portion of a sectional view taken along a line III—III shown in FIG. 1.
Figure 4:
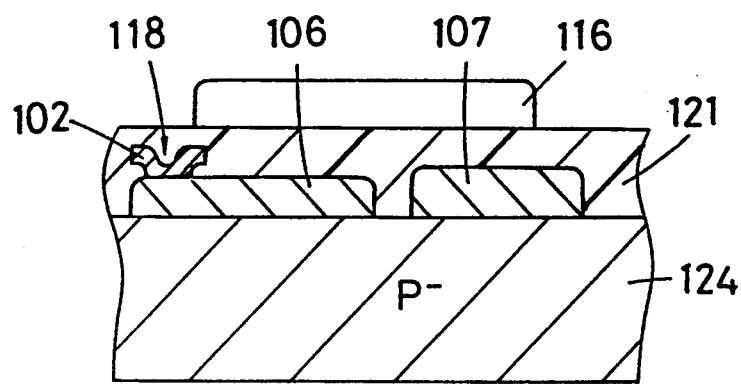
FIG. 4 is a key portion of a sectional view taken along a line IV—IV shown in FIG. 1.

FIG. 1 is a plan view showing a standard cell 101 in accordance with an embodiment of the present invention, FIG. 2 is a sectional view taken along a line II—II shown in FIG. 1, FIG. 3 is a sectional view taken along a line III—III shown in FIG. 1 and FIG. 4 is a sectional view taken along a line IV—IV shown in FIG. 1. The standard cell 101 serving as a second unit circuit element is an inverter logic cell. A substrate 124 of the standard cell 101 is a P− type substrate on which an active element area 104 serving as a P channel transistor and an active element area 105 serving as an N channel transistor are arranged in the longitudinal direction of FIG. 1. An N− type layer is formed in an upper surface region 124a of the substrate 124 and the area of the N− type layer is aligned to the active element area 104.

In the active element area 104, a drain 119 serving as a P+ type layer is formed in the N− type layer in the longitudinal direction of FIG. 1 and a source 120 serving also as the P+ type layer is formed in parallel with the drain 119. A power source line 114 is formed above the source 120 and the power source line 114 is connected to the source 120 at a plurality of connecting positions 108.

In the active element area 105, a drain (not shown) serving as an N+ type layer is formed in the longitudinal direction of FIG. 1 and a source (not shown) serving also as the N+ type layer is formed in parallel with the drain. A ground line 115 is formed above the source and the ground line 115 is connected to the source at a plurality of connecting positions 110.

A gate 106, which is shown by slanted hatching lines in FIG. 1, is formed between the drain 119 and the source 120 in the active element area 104, and between the drain and the source in the active element area 105 over both the active element areas 104 and 105. The gate 106 has a projected branch from a longitudinal length at a point between the active element areas 104 and 105 so as to form a lateral T letter shape. The ends of the gate 106 are connected to input terminals 102 and 102a at connecting positions 118.

A first wiring line 107 is formed on the drain 119 in the active element area 104 and on the drain (not shown) in the active element area 105. The drain 119 in the active element area 104 is connected to the first wiring line 107 at a plurality of connecting positions 112 and the drain in the active element area 105 is connected to the first wiring line 107 at a plurality of connecting positions 113. The first wiring line 107 is formed into an almost H shape in section and two ends of the first wiring line 107 are output terminals 103 and 103a.

A power source terminal line 116 is formed on the active element area 104 through an insulator 121 so as to cover the gate 106, the first wiring line 107 and the power source line 114. The power source terminal line 116 is connected to the power source line 114 at a plurality of connecting positions 109.

A ground terminal line 117 is formed above the active element area 105 through the insulator 121 so as to cover the gate 106, the first wiring line 107 and the ground line 115. The ground terminal line 117 is connected to the ground line 115 at a plurality of connecting positions 111.

The power source terminal line 116 is a terminal for supplying a power source potential and the ground terminal line 117 is a terminal for supplying a ground potential.

While a height of the standard cell 101 between the input terminals 102 and 102a and between the output terminals 103 and 103a is H, a height of the gate 106 is H plus h on both upper and lower sides in FIG. 1. The standard cell 101 is W2 in width.

Figure 5:
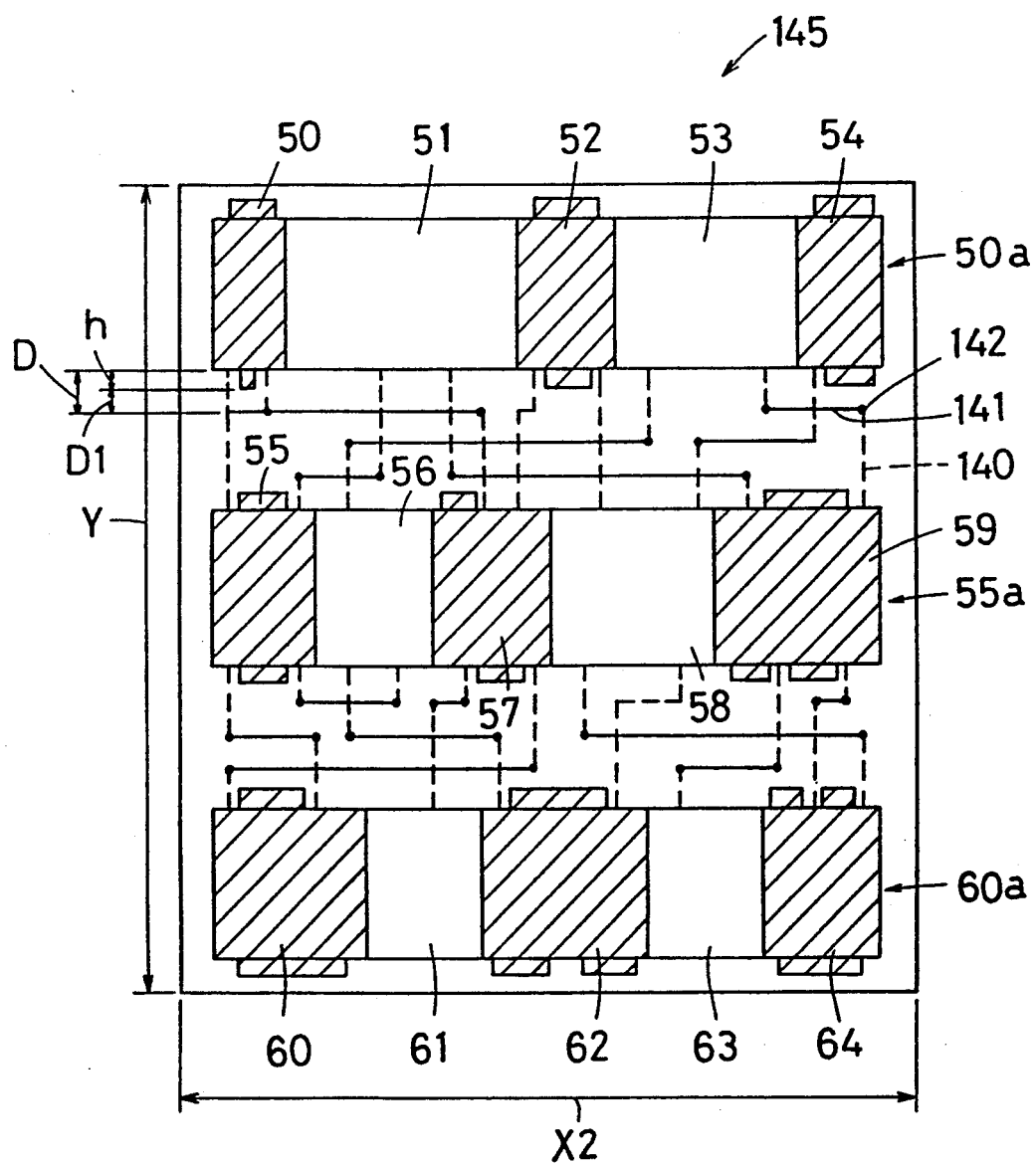
FIG. 5 is a plan view showing an example of a semiconductor integrated circuit 145 using standard cells 50, 52, 54, 55, 57, 59, 60, 62 and 64 in accordance with the embodiment of the present invention.

FIG. 5 is a plan view showing an example of a semiconductor integrated circuit 145 using standard cells 50, 52, 54, 55, 57, 59, 60, 62, and 64 in accordance with the embodiment of the present invention. The standard cells 50 to 54, 55 to 59 and 60 to 64 form cell rows 50a, 55a, 60a of the unit circuit element row, respectively in the integrated circuit 45. Each of the standard cells 50 to 64 and each of the cell rows 50a, 55a and 60a are connected by a first layer line 140 and a second layer line 141. The first layer line 140 is connected to the second layer line 141 at a connecting position 142.

The semiconductor integrated circuit 145 is Y in height and X2 in width.

A first reference distance between the standard cells 51, 53, 56, 58, 61 and 63 of the first unit circuit element having a height of H and the nearest second layer line 140 and 141 is D. Meanwhile, a second reference distance between the standard cells 50, 52, 54, 55, 57, 59, 60, 62, and 64 of the second unit circuit element having a height of H+2h and the nearest first and second layer lines 140 and 141 is D1.

Although the distance should be always D or more in the conventional example, it is confirmed that a signal interference will not generated if the distance is D1 or more. Therefore, if the height h of the standard cells 50, 52, 54, 55, 57, 59, 60, 62, 64, and 101, which is projected from both vertical ends in FIGS. 1 and 5, is less than D−D1 which is the longest length in which the signal interference is not generated, those standard cells can be used as the standard cells of the semiconductor integrated circuit 145.

The standard cell 101 has the same function as that of the conventional standard cell 1 of the first unit circuit element. The standard cell 101 is longer than the standard cell 1 by h which is projected from both sides thereof in the longitudinal direction of FIG. 1. Therefore, even if the source 120 is provided at one position in the active element area 104, a sufficient output can be obtained because a length of the gate 106 is sufficient. Thus, the source 20 which was provided at two positions in the conventional standard cell 1 is provided only at one position in the standard cell 101. This is the same as in the active element region 105. Therefore, the width W2 of the standard cell 101 is less than the width W1 of the standard cell 1. In addition, an area occupied by the active elements 104 and 105 in the cell 101 is increased.

The same provisions are applied to the standard cells 50, 52, 54, 55, 57, 59, 60, 62 and 64.

Therefore, a width X2 of the semiconductor integrated circuit 145 including the standard cells 50, 52, 54, 55, 57, 59, 60, 62, and 64 having the width W2 less than W1 is less than a width X1 of the conventional semiconductor integrated circuit 45.

As described above, according to this embodiment of the present invention, the distance between the input terminals 102 and 102a is H and the gate 106 is projected from both ends by h in the longitudinal direction of FIG. 1. Thus, the width W2 of the standard cell 101 can be less than the width W1 of the conventional standard cell 1. Therefore, the width X2 of the semiconductor integrated circuit 145 including the standard cells 50, 52, 54, 55, 57, 59, 60, 62, and 64 is less than the width X1 of the conventional semiconductor integrated circuit.

Although an inverter logic cell was described as the standard cell 101 in this embodiment of the present invention, the present invention is not limited to this inverter logic cell and various kinds of logic cells such as an AND logic cell or an OR logic cell can be used. In addition, although there are 15 standard cells 50 to 64 forming the semiconductor integrated circuit 145, the number of the cells is not limited to this.

Although there are nine standard cells 50, 52, 54, 55, 57, 59, 60, 62 and 64 used in the semiconductor integrated circuit 145 in this embodiment of the present invention, the number of the cells is not limited to this. The number of the standard cells used in the semiconductor integrated circuit in this embodiment may be one or more.

In addition, although the end of the height h is that of the gate 106, it may be the end of other line or the active element.

According to the present invention, since the second unit circuit element containing at least one part is projected in the first direction so that it may be apart from the connecting line by the second reference distance which is shorter than the first reference distance, a length of the second unit circuit element in the second direction is reduced in comparison with the length of the first unit circuit element.

While only certain presently preferred embodiments have been described in detail, as will be apparent with those skilled in the art, certain changes and modifications can be made without departing from the scope of the invention as defined by the following claims.

What is claimed is:

1. A semiconductor integrated circuit including a plurality of unit circuit element rows connected to each other by connecting lines, each of said plurality of unit circuit element rows having a first predetermined length in a first direction crossing a second direction and having a second variable length in said second direction and a plurality of unit circuit element rows being formed by connecting unit circuit elements in said second direction, said semiconductor integrated circuit device comprising:

a first unit circuit element arranged apart from the nearest connecting line along the first direction by a first reference distance; and a second unit circuit element having a third length in said first direction and arranged apart from said nearest connecting line by a second reference distance which is shorter than said first reference distance and having a fourth length in said second direction which is reduced as compared with said second length of said first unit circuit element.

2. A semiconductor integrated circuit device as set forth in claim 1, wherein said second reference distance corresponds to a distance between said nearest connecting line along said first direction and said second unit circuit element which prevents signal interference between said nearest connecting line and said second unit circuit element from being generated.

3. A semiconductor integrated circuit device as set forth in claim 1, wherein said first and second unit circuit elements comprise standard cells each having predetermined logic functions.

4. A semiconductor integrated circuit device as set forth in claim 3, wherein said standard cell is an inverter logic cell.

5. A method of forming a semiconductor integrated circuit device comprising the steps of:
(a) connecting a plurality of unit circuit elements to each other by connecting lines;
(b) forming each of said plurality of unit circuit elements to have a first predetermined length in a first direction crossing a second direction and a second variable length in said second direction wherein unit circuit elements are connected in said second direction;
(c) arranging a first unit circuit element apart from the nearest connecting line along said first direction by a first reference distance; and
(d) arranging a second unit circuit element having a third length in said first direction apart from said nearest connecting line by a second reference distance which is shorter than said first reference distance and having a fourth length in said second direction which is reduced as compared with said second length of said first unit circuit elements.

6. A method of forming a semiconductor integrated circuit device as set forth in claim 5, wherein said second reference distance separates said nearest connecting line and said second unit circuit element by a distance which prevents signal interference between said nearest connecting line and said second unit circuit element from being generated.

* * * * *